United States Patent
Bahr et al.

(10) Patent No.: US 12,224,708 B2
(45) Date of Patent: Feb. 11, 2025

(54) MULTI-PHASE OSCILLATORS

(71) Applicant: Texas Instruments Incorporated, Dallas, TX (US)

(72) Inventors: Bichoy Bahr, Allen, TX (US); Michael Henderson Perrott, Nashua, NH (US); Baher Haroun, Allen, TX (US); Swaminathan Sankaran, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 162 days.

(21) Appl. No.: 17/389,935

(22) Filed: Jul. 30, 2021

(65) Prior Publication Data
US 2023/0035350 A1 Feb. 2, 2023

(51) Int. Cl.
*H03B 5/32* (2006.01)
*G06F 1/04* (2006.01)

(52) U.S. Cl.
CPC ............... *H03B 5/326* (2013.01); *G06F 1/04* (2013.01)

(58) Field of Classification Search
CPC .................................. H03B 5/326; G06F 1/04
USPC .......................................................... 331/50
See application file for complete search history.

(56) References Cited

U.S. PATENT DOCUMENTS

| | | | | |
|---|---|---|---|---|
| 7,342,462 B1* | 3/2008 | Chen | ........................ | H03L 7/099 331/177 V |
| 7,656,984 B2* | 2/2010 | Kim | ........................ | H04L 7/0338 375/373 |
| 11,115,033 B1* | 9/2021 | Wu | ........................ | H03L 7/0895 |
| 11,228,280 B1* | 1/2022 | Bahr | ........................ | H03B 5/04 |
| 2002/0093385 A1* | 7/2002 | Nishiyama | ............. | H03B 27/00 331/46 |
| 2011/0018649 A1* | 1/2011 | David | .................... | H03B 5/326 310/318 |
| 2019/0109075 A1* | 4/2019 | Bahr | ................. | H01L 23/49548 |
| 2020/0076366 A1* | 3/2020 | Bahr | ...................... | H03B 5/326 |
| 2020/0195259 A1* | 6/2020 | Zhang | ...................... | H03B 1/04 |
| 2022/0247396 A1* | 8/2022 | Shehata | ............. | H03K 5/00006 |

OTHER PUBLICATIONS

B. Bahr, A. Kiaei, M. Chowdhury, B. Cook, S. Sankaran and B. Haroun; Title: "Near-Field-Coupled Bondless BAW Oscillators in WCSP Package with 46fs Jitter"; Date of conference: Jun. 7-9, 2021; Date added: Jul. 29, 2021; Publisher: IEEE Radio Frequency Integrated Circuits Symposium (RFIC), pp. 155-158 (Year: 2021).*

(Continued)

*Primary Examiner* — Richard Tan
(74) *Attorney, Agent, or Firm* — Frank D. Cimino

(57) ABSTRACT

An oscillator circuit includes a first BAW oscillator, a first coupling stage, a second BAW oscillator, and a second coupling stage. The first BAW oscillator is configured to generate a first output signal at a frequency. The first coupling stage is coupled to the first BAW oscillator, and is configured to amplify the first output signal. The second BAW oscillator is coupled to the first coupling stage, and is configured to generate a second output signal at the frequency. The second output signal differs in phase from the first output signal. The second coupling stage is coupled to the first BAW oscillator and the second BAW oscillator, and is configured to amplify the second output signal and drive the first BAW oscillator.

26 Claims, 7 Drawing Sheets

(56) References Cited

OTHER PUBLICATIONS

J. Koo, K. Wang, R. Ruby and B. P. Otis, Title: "A 2-GHz FBAR-Based Transformer Coupled Oscillator Design With Phase Noise Reduction," in IEEE Transactions on Circuits and Systems II: Express Briefs, vol. 66, No. 4, pp. 542-546, Apr. 2019 (Year: 2019).*

Author: Shailesh S. Rai et al.; Title: "A 600 µW BAW Tuned Quadrature VCO Using Source Degenerated Coupling"; Date: Jan. 2008; Publisher: IEEE; vol. 43; Pertinent pp. 300-305 (Year: 2008).*

* cited by examiner

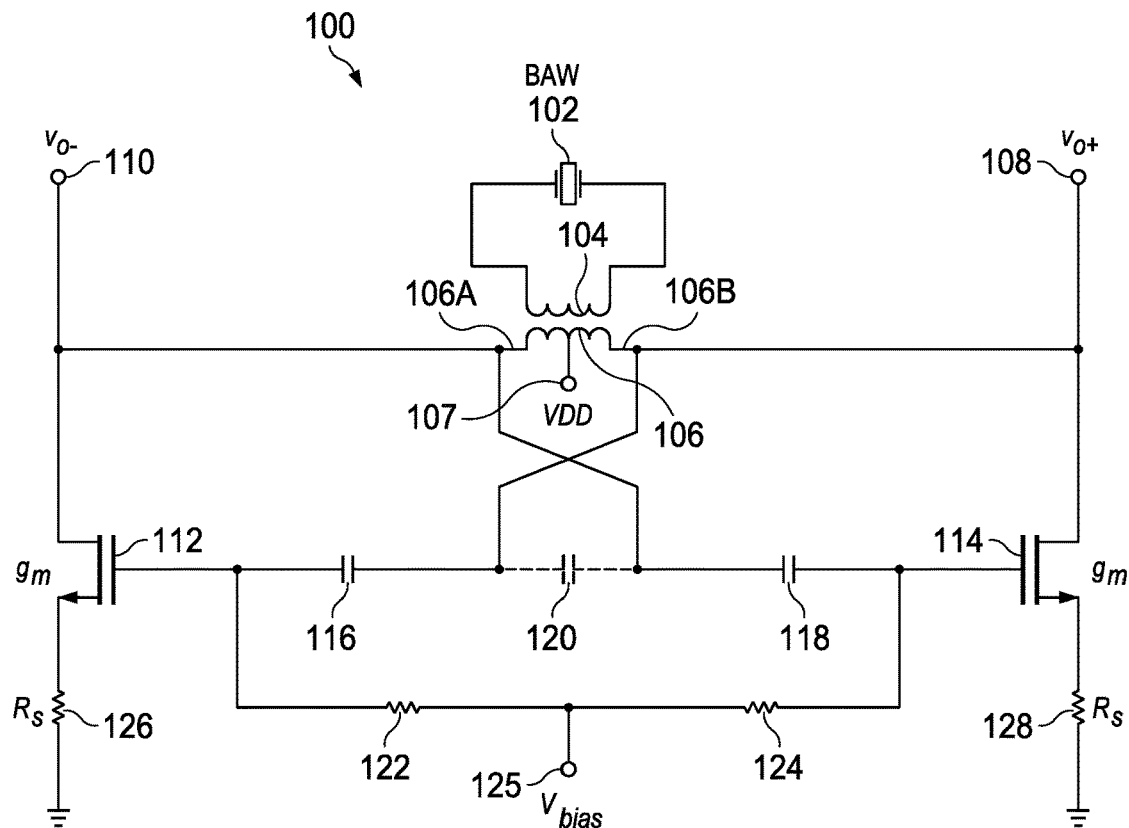
FIG. 1A
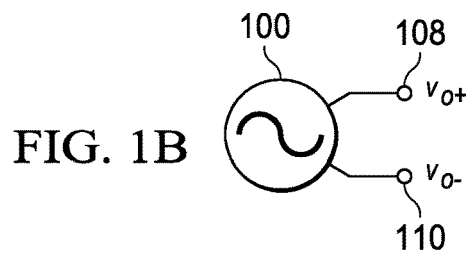
FIG. 1B
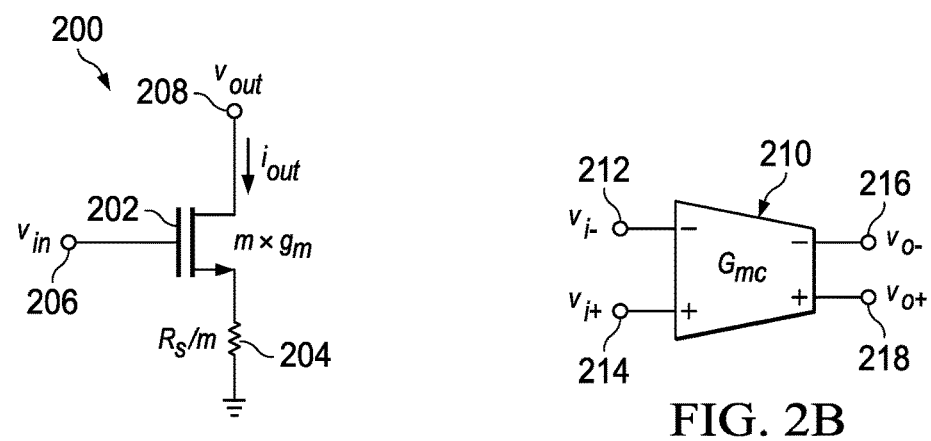
FIG. 2A
FIG. 2B

MULTI-PHASE OSCILLATORS

BACKGROUND

Resonators are generally passive devices that are combined with active circuitry to create an oscillator. The oscillator produces a signal at the resonant frequency of the resonator. A crystal oscillator, for example, is an electronic circuit that uses the mechanical resonance of a vibrating crystal to create an electrical signal with a very precise frequency. Crystal oscillators may be used to generate frequencies to keep track of time or to generate a clock signal for digital integrated circuits. MEMS resonators may be used in place of crystal resonators to keep track of time and to generate a stable dock signal for digital integrated circuits.

SUMMARY

In one example, an oscillator circuit includes a first bulk acoustic wave (BAW) oscillator, a first coupling stage, a second BAW oscillator, and a second coupling stage. The BAW oscillator includes a first output and a second output. The first coupling stage includes a first input, a second input, a first output, and a second output. The first input is coupled to the first output of the first BAW oscillator. The second input is coupled to the second output of the first BAW oscillator. The second BAW oscillator includes a first output and a second output. The first output of the second BAW oscillator is coupled to the first output of the first coupling stage. The second output of the second BAW oscillator is coupled to the second output of the first coupling stage. The second coupling stage includes a first input, a second input, a first output, and a second output. The first input of the second coupling stage is coupled to the second output of the second BAW oscillator. The second input of the second coupling stage is coupled to the first output of the second BAW oscillator. The first output of the second coupling stage is coupled to the first output of the first BAW oscillator. The second output of the second coupling stage is coupled to the second output of the first BAW oscillator.

In another example, an oscillator circuit includes a first BAW oscillator, a first coupling stage, a second BAW oscillator, and a second coupling stage. The first BAW oscillator is configured to generate a first output signal at a frequency. The first coupling stage is coupled to the first BAW oscillator, and is configured to amplify the first output signal. The second BAW oscillator is coupled to the first coupling stage, and is configured to generate a second output signal at the frequency. The second output signal differs in phase from the first output signal. The second coupling stage is coupled to the first BAW oscillator and the second BAW oscillator, and is configured to amplify the second output signal and drive the first BAW oscillator.

In a further example, an oscillator circuit includes a first BAW oscillator, a first coupling stage, a second BAW oscillator, a second coupling stage, and combiner circuitry. The first BAW oscillator is configured to generate a first output signal at a frequency. The first coupling stage is coupled to the first BAW oscillator, and is configured to amplify the first output signal. The second BAW oscillator is coupled to the first coupling stage, and is configured to generate a second output signal at the frequency. The second output signal differs in phase from the first output signal. The second coupling stage is coupled to the first BAW oscillator and the second BAW oscillator, and is configured to amplify the second output signal and drive the first BAW oscillator. The combiner circuitry is coupled to the first BAW oscillator and the second BAW oscillator, and is configured to generate, based on the first output signal and the second output signal, a third output signal having a frequency that is a multiple of a frequency of the first output signal.

BRIEF DESCRIPTION OF THE DRAWINGS

FIG. 1A is a schematic level diagram of a bulk acoustic wave (BAW) oscillator;

FIG. 1B illustrates a symbol for the BAW oscillator of FIG. 1A.

FIG. 2A is schematic level diagram of a buffer circuit suitable for use with the BAW oscillator of FIG. 1B.

FIG. 2B shows a coupling stage that includes the buffer circuit of FIG. 1A.

DETAILED DESCRIPTION

Figure 3:
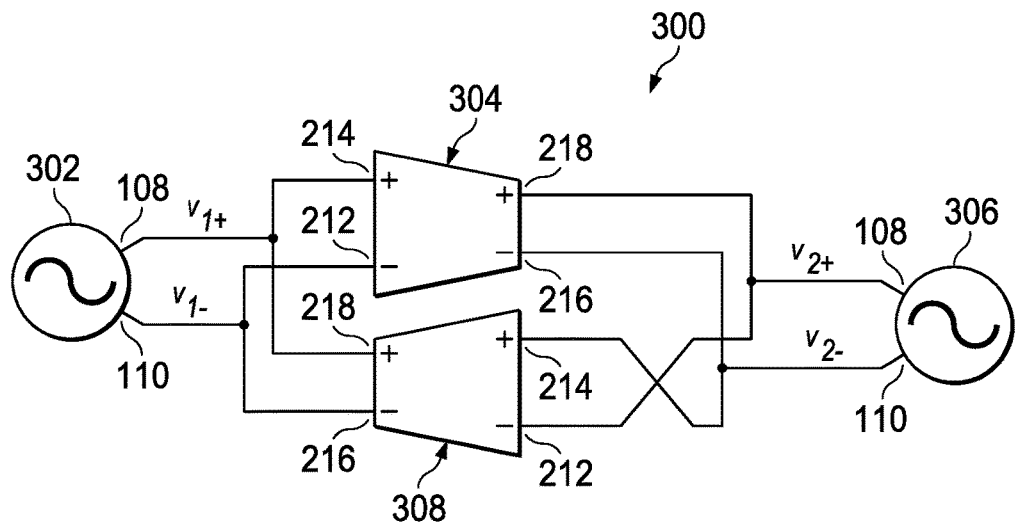
FIG. 3 is a block diagram of a quadrature oscillator that uses the BAW oscillator of FIG. 1A and the coupling stage of FIG. 2B.

Multi-phase clock signals are used in a variety of applications. For example, multi-phase clock signals are used in data converters, radio frequency local oscillators, and other applications. Multi-phase clock signals may be combined to produce higher output clock frequencies. Multiple oscillators may be operated in combination to generate a multi-phase clock signal.

The multi-phase oscillators described herein combine multiple inductively coupled bulk acoustic wave (BAW) oscillators, and multiple coupling stages to generate multi-phase oscillator signals. The multi-phase oscillators have low root mean squared (RMS) jitter (e.g., as low as 21 femto-seconds (fs) per phase), low current consumption (e.g., as low as 10.7 milliamperes (mA)), and a high power-jitter figure of merit (FOM) (e.g., −262 decibels (dB)) relative to multi-phase inductor-capacitor oscillators. Power-jitter FOM is jitter*power consumption, where lower jitter or lower power leads to a better power-jitter FOM. The multi-phase BAW oscillators may be used with a frequency multiplication circuit to generate higher frequencies higher than the BAW oscillator output frequency.

FIG. 1A is a schematic level diagram of a bulk acoustic wave (BAW) oscillator 100. The BAW oscillator 100 includes a BAW resonator 102, an inductor 104, an inductor 106, a transistor 112, a transistor 114, a capacitor 116, a capacitor 118, a capacitor 120, a resistor 122, a resistor 124, a resistor 126, and a resistor 128. The BAW resonator 102 is coupled to the inductor 104. The inductor 106 is coupled to the transistor 112 and the transistor 114, and is magnetically coupled to the inductor 104 to form a transformer. The inductor 106 includes a center tap terminal 107 that is coupled to a power supply voltage in some implementations. A drain of the transistor 112 is coupled to a terminal 106A of the inductor 106 and to an output 110. A drain of the transistor 114 is coupled to a terminal 106B of the inductor 106 and to an output 108. The source of the transistor 112 is coupled to ground via the resistor 126, and the source of the transistor 114 is coupled to ground via the resistor 128. The gate of the transistor 112 is coupled to the terminal 106B of the inductor 106 via the capacitor 116, and the gate of the transistor 114 is coupled to the terminal 106A via the capacitor 118. In some implementations, the capacitor 116 is coupled to the capacitor 118 via the capacitor 120. The gate of the transistor 112 is coupled to a bias voltage terminal 125 via the resistor 122, and the gate of the transistor 114 is coupled to the bias voltage terminal 125 via the resistor 124. FIG. 1B shows a symbol used in this description to represent the BAW oscillator 100.

FIG. 2A is schematic level diagram of a buffer circuit 200 suitable for use with the BAW oscillator 100. The buffer circuit 200 includes a transistor 202 and a resistor 204. The source of the transistor 202 is coupled to ground via the resistor 204. The gate of the transistor 202 is coupled to an input terminal 206 and the drain of the transistor 202 is coupled to an output terminal 208.

FIG. 2B shows a coupling stage 210 that includes two instances of the buffer circuit 200. The coupling stage 210 includes an input 212, an output 216, an input 214, and an output 218. A first instance of the buffer circuit 200 is coupled between the input 212 and the output 216. A second instance of the buffer circuit 200 is coupled between the input 214 and the output 218.

In some implementations, a coupling stage can be as simple as a single element (a capacitor, a resistor, a transformer), a buffer, an attenuator, or a transconductance. When implemented using the buffer circuit 200, the coupling stage 210 is a transconductance stage.

FIG. 3 is a block diagram of a quadrature oscillator 300 that uses the BAW oscillator 100 and the coupling stage 210. The quadrature oscillator 300 includes a BAW oscillator 302, a coupling stage 304, a BAW oscillator 306, and a coupling stage 308. The BAW oscillator 302 and the BAW oscillator 306 are instances of the BAW oscillator 100. The coupling stage 304 and the coupling stage 308 are instances of the coupling stage 210. The BAW oscillator 302 and the BAW oscillator 306 generate outputs having approximately the same frequency. The output 108 of the BAW oscillator 302 is coupled to the input 214 of the coupling stage 304, and the output 110 of the BAW oscillator 302 is coupled to the input 212 of the coupling stage 304. The output 218 of the coupling stage 304 is coupled to the output 108 of the BAW oscillator 306, and the output 216 of the coupling stage 304 is coupled to output 110 of the BAW oscillator 306. The input 212 of the coupling stage 308 is coupled to the output 108 of the coupling stage 304, and the input 214 of the coupling stage 308 is coupled to the output 110 of the BAW oscillator 306. The output 216 of the coupling stage 308 is coupled to the output 110 of the BAW oscillator 302, and the output 218 of the coupling stage 308 is coupled to the output 108 of the BAW oscillator 302. The coupling/injection factor (m) of the quadrature oscillator 300 may be about 0.5. The coupling/injection factor (m) represents the ratio of coupling current between the standalone oscillator current and the injection current from the coupled oscillators. The per phase RMS jitter of the quadrature oscillator 300 may be about 21 fs. The power consumption of the quadrature oscillator 300 may be about 10.7 mA at 1.35 volts. The power-jitter FOM of the quadrature oscillator 300 may be about −262 dB.

Figure 4:
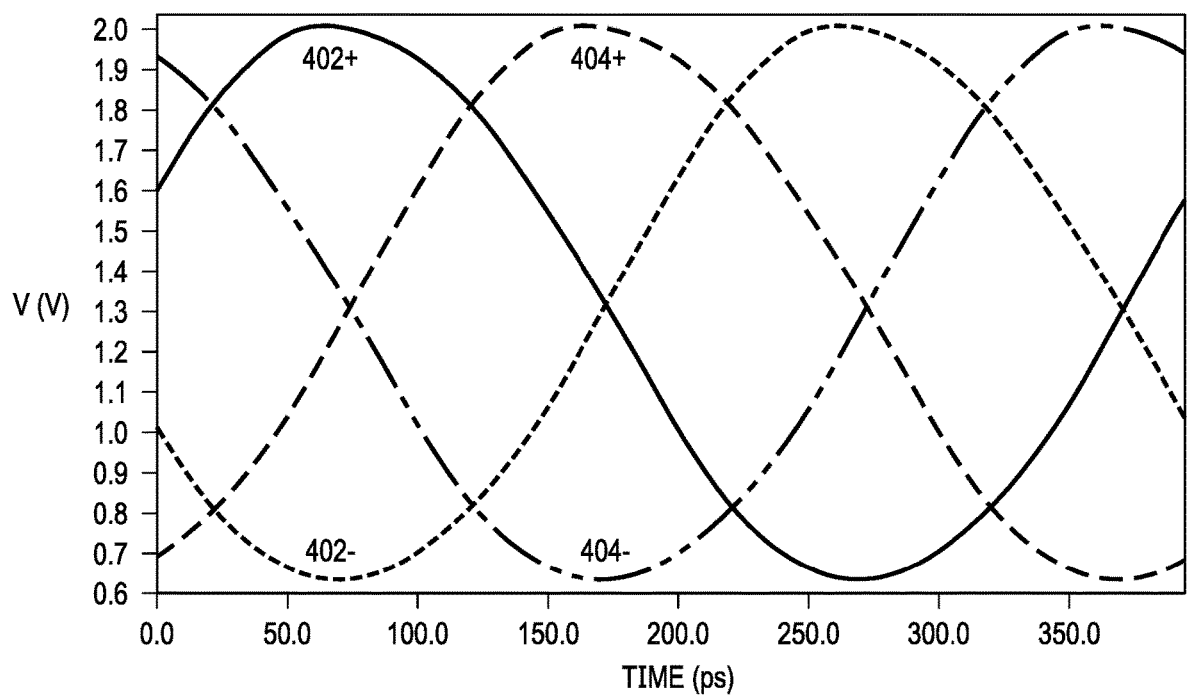
FIG. 4 is a graph of the output of the quadrature oscillator of FIG. 3.

FIG. 4 is a graph of the output signal of the quadrature oscillator 300. FIG. 4 shows the output signals $v_1+$ and $v_1-$ of the BAW oscillator 302, and the output signals $v_2+$ and $v_2-$ of the BAW oscillator 306. The $v_2+$ and $v_2-$ are shifted by 90° relative to the $v_1+$ and $v_1-$.

Figure 5:
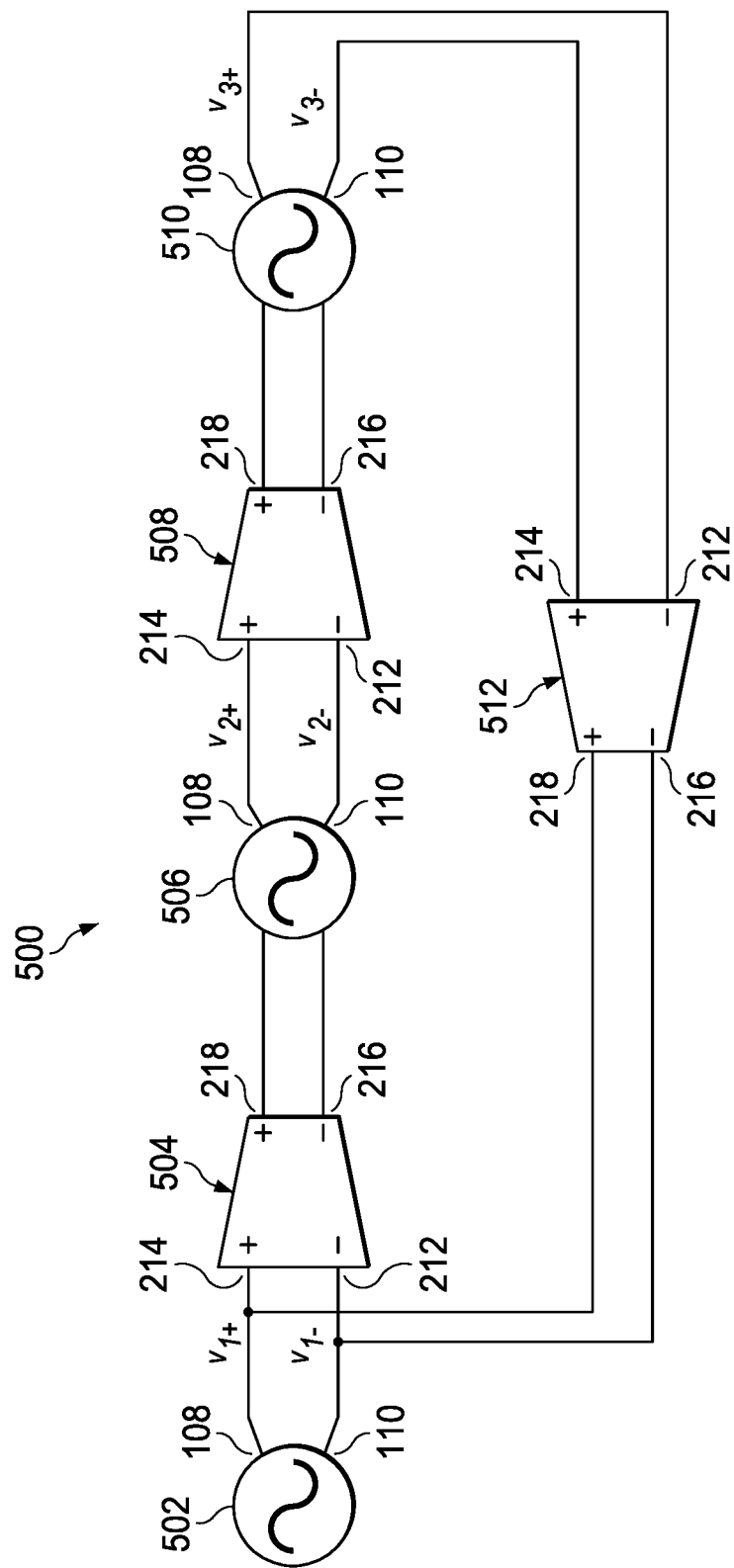
FIG. 5 is a block diagram of a three-phase oscillator that uses the BAW oscillator of FIG. 1A and the coupling stage of FIG. 2B.

FIG. 5 is a block diagram of a three-phase oscillator 500 that uses the BAW oscillator 100 and the coupling stage 210. The three-phase oscillator 500 includes a BAW oscillator 502, a coupling stage 504, a BAW oscillator 506, a coupling stage 508, a BAW oscillator 510, and a coupling stage 512. The BAW oscillator 502, the BAW oscillator 506, and the BAW oscillator 510 may be instances of the BAW oscillator 100. The coupling stage 504, the coupling stage 508, and the BAW oscillator 510 may be instances of the coupling stage 210. The BAW oscillator 502, the BAW oscillator 506, and the BAW oscillator 510 generate outputs having approximately the same frequency. The output 108 and the output 110 of the BAW oscillator 502 are respectively coupled to the input 214 and the input 212 of the coupling stage 504. The output 218 and the output 216 of the coupling stage 504 are respectively coupled to the output 108 and the output 110 of the BAW oscillator 506. The output 108 and the output 110 of the BAW oscillator 506 are respectively coupled to the input 214 and the input 212 of the coupling stage 508. The output 218 and the output 216 of the coupling stage 508 are respectively coupled to the output 108 and the output 110 of the BAW oscillator 510. The output 108 and the output 110 of the BAW oscillator 510 are respectively coupled to the input 212 and the input 214 of the coupling stage 512. The output 218 and the output 216 of the coupling stage 512 are respectively coupled to the output 108 and the output 110 of the BAW oscillator 502. The coupling/injection factor (m) of the three-phase oscillator 500 may be about 0.5. The per phase RMS jitter of the three-phase oscillator 500 may be about 28.5 fs. The power consumption of the three-phase oscillator 500 may be about 15 mA at 1.35 volts. The power-jitter FOM of the quadrature oscillator 300 may be about −258 dB.

Multi-phase oscillators similar to the quadrature oscillator 300 and the three-phase oscillator 500 may be constructed using more than three (e.g., 4, 5, 6, etc.) BAW oscillators and coupling stages arranged in a loop.

Figure 6:
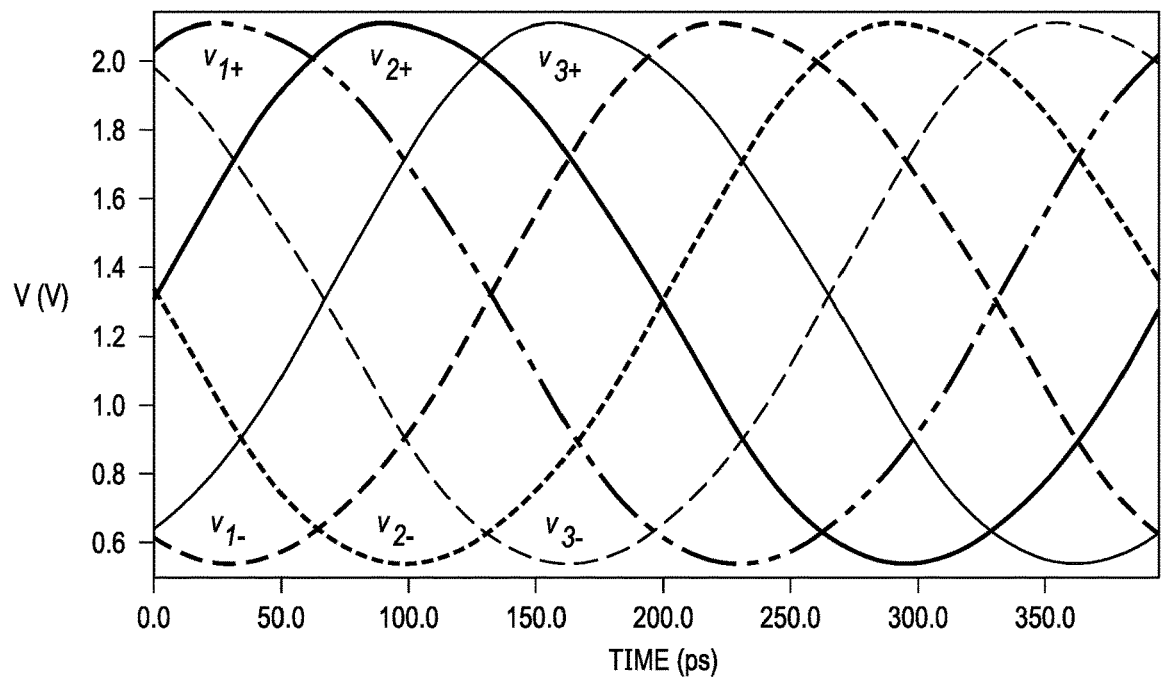
FIG. 6 is a graph of the output of the three-phase oscillator of FIG. 5.

FIG. 6 is a graph of the output of the three-phase oscillator 500. FIG. 6 shows the output signals $v_1+$ and $v_1-$ of the BAW oscillator 502, output signals $v_2+$ and $v_2-$ of the BAW oscillator 506, and output signals $v_3+$ and $v_3-$ of the BAW oscillator 510. The $v_2+$ and $v_2-$ are shifted by 60° relative to the $v_1+$ and $v_1-$, and the $v_3+$ and $v_3-$ are shifted by 120° relative to the $v_1+$ and $v_1-$.

Figure 7:
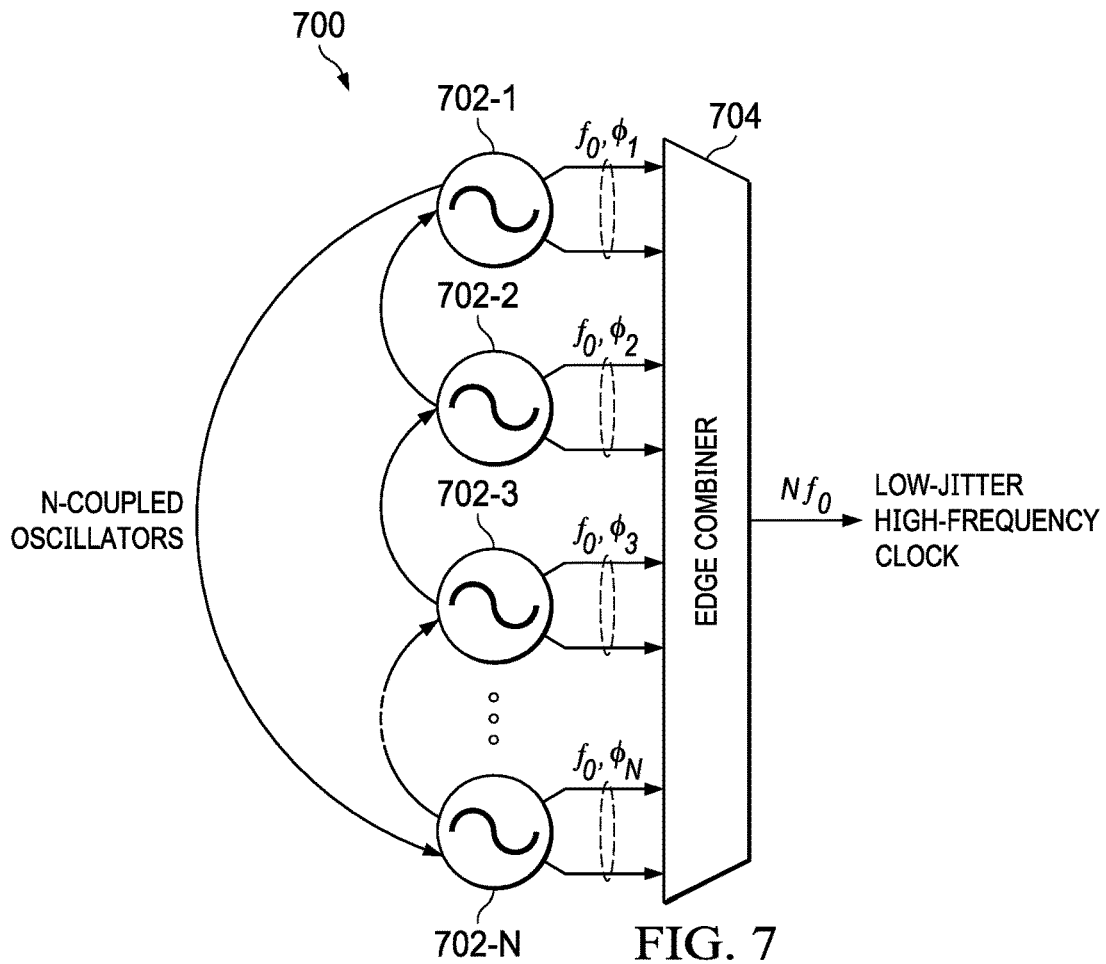
FIG. 7 is block diagram of a frequency multiplication circuit that uses a multi-phase oscillator based on the BAW oscillator of FIG. 1A.

FIG. 7 is block diagram of a frequency multiplication circuit 700 that that uses the BAW oscillator 100 and the coupling stage 210. The frequency multiplication circuit 700 includes multiple (N) BAW oscillators 702-1, 702-2, 702-3 and 702-N (each generically a BAW oscillator 702), and edge combiner circuit 704. Each BAW oscillator 702 may be an instance of the BAW oscillator 100. The frequency multiplication circuit 700 may also include multiple instances of the coupling stage 210, each instance of the coupling stage 210 coupled between two of the BAW oscillators 702 as shown in the quadrature oscillator 300 and the three-phase oscillator 500. Like the quadrature oscillator 300 and the three-phase oscillator 500, each of the BAW oscillators 702 generates an output having approximately the same frequency and a different phase. An output of each BAW oscillator 702 is coupled to an input of the edge combiner circuit 704.

The edge combiner circuit 704 includes circuitry that identifies the edges of each oscillator signal received from one of the BAW oscillators 702, generates a pulse at each identified edge, and combines the pulses to produce a high frequency oscillator signal. For example, the output signal of the edge combiner circuit 704 may be N times higher than the frequency of the output signal of the BAW oscillator 702-1.

Figure 8:
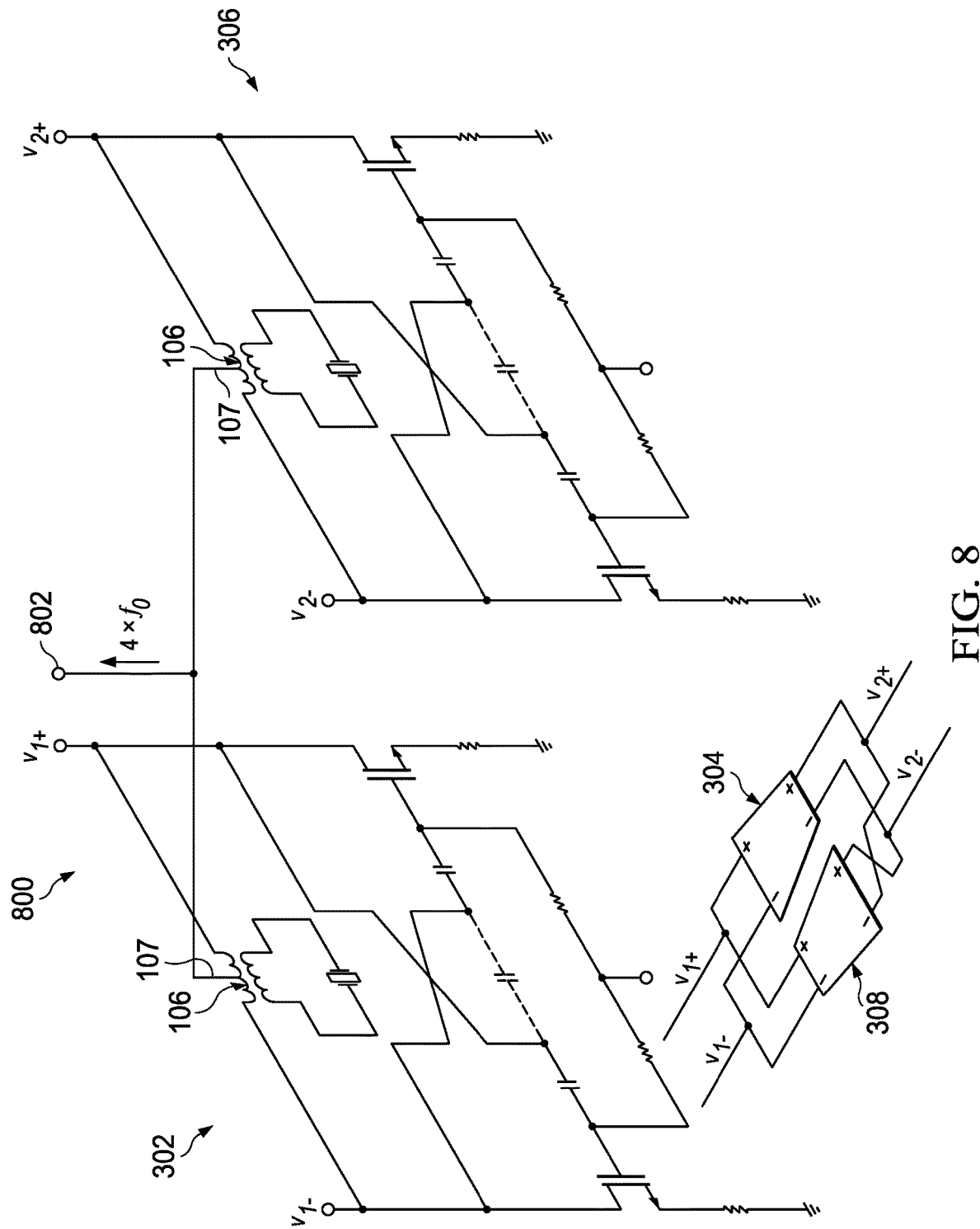
FIG. 8 is a schematic level diagram of a frequency multiplication circuit that uses a multi-phase BAW oscillator.

FIG. 8 is a schematic level diagram of a frequency multiplication circuit 800 that uses a multi-phase BAW oscillator. The frequency multiplication circuit 800 is similar to the quadrature oscillator 300, and includes the BAW oscillator 302, the coupling stage 304, the BAW oscillator 306, and the coupling stage 308. In the frequency multiplication circuit 800, the center tap terminal 107 of the inductor 106 of the BAW oscillator 302 is coupled (e.g., by a conductor) to the center tap terminal 107 of the inductor 106 of the BAW oscillator 306, and to the output terminal 802. The frequency of the signal at the output terminal 802 is four times the frequency of the output signal ($v_1\pm$) of the BAW oscillator 302 or the BAW oscillator 306.

Figure 9:
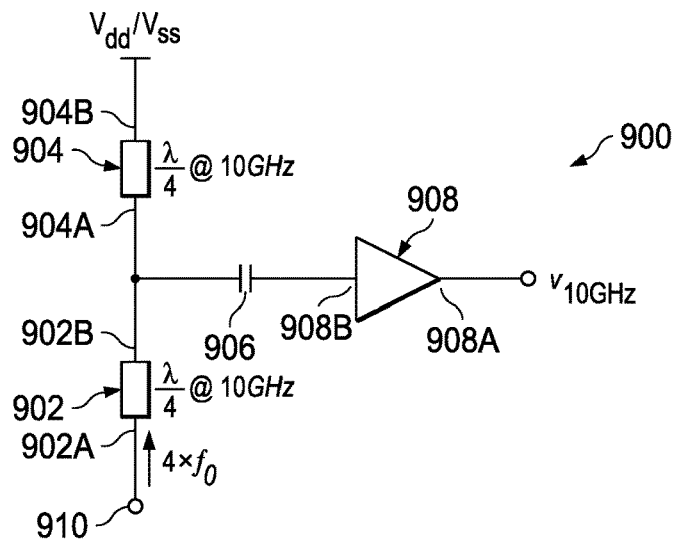
FIGS. 9-11 are block diagrams of harmonic extraction circuits suitable for use with the frequency multiplication circuit of FIG. 8.
Figure 10:
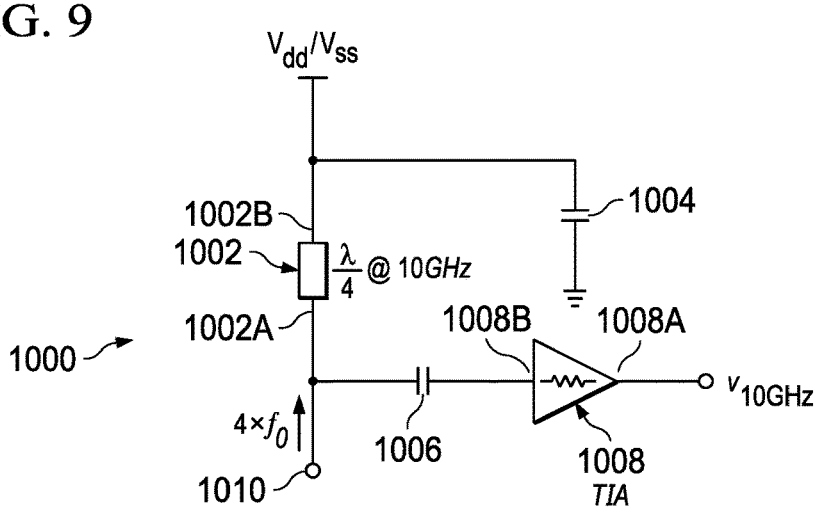
Figure 11:
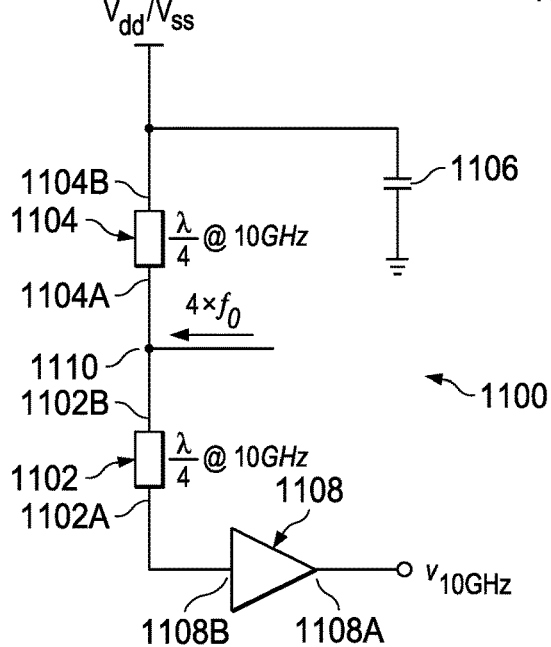

FIGS. 9-11 are block diagrams of harmonic extraction circuits suitable for use with the frequency multiplication circuit 800. FIG. 9 shows a harmonic extraction circuit 900 that includes a quarter-wavelength transmission line 902, a quarter-wavelength transmission line 904, a capacitor 906, and an amplifier 908. The terminal 902A of the quarter-wavelength transmission line 902 is coupled to the input terminal 910. The terminal 902B of the quarter-wavelength transmission line 902 is coupled to the terminal 904A of the quarter-wavelength transmission line 904, and to the input 908B of the amplifier 908 via the capacitor 906. The terminal 904B of the quarter-wavelength transmission line 904 is coupled to $V_{ss}$ or $V_{dd}$.

The quarter-wavelength transmission line 902 and the quarter-wavelength transmission line 904 are tuned for a selected frequency. For example, in the harmonic extraction circuit 900, the quarter-wavelength transmission line 902 and the quarter-wavelength transmission line 904 are tuned for a quarter-wavelength at 10 GHz. If output signal $v1\pm$ of the frequency multiplication circuit 800 is 2.5 GHz, the frequency of the output signal at the output terminal 802 is 10 GHz. The 10 GHz signal is provided to the amplifier 908 via the capacitor 906. The amplifier 908 amplifies the 10 GHz signal and provides the amplified 10 GHz signal at the output 908A.

FIG. 10 shows a harmonic extraction circuit 1000 that includes a quarter-wavelength transmission line 1002, a capacitor 1004, a capacitor 1006, and an amplifier 1008. The amplifier 1008 is a transimpedance amplifier. A terminal 1002A of the quarter-wavelength transmission line 1002 is coupled to an input terminal 1010, and to an input 1008B of the amplifier 1008 via the capacitor 1006. The terminal 1002B of the quarter-wavelength transmission line 1002 is coupled to the capacitor 1004 and to $V_{ss}$ or $V_{dd}$.

The quarter-wavelength transmission line 1002 is tuned for a selected frequency. For example, in the harmonic extraction circuit 1000, the quarter-wavelength transmission line 1002 is tuned for a quarter-wavelength at 10 GHz. If output signal $v1\pm$ of the frequency multiplication circuit 800 is 2.5 GHz, the frequency of the output signal at the output terminal 802 is 10 GHz. The 10 GHz signal is provided to the amplifier 1008 via the capacitor 1006. The amplifier 1008 amplifies the 10 GHz signal and provides the amplified 10 GHz signal at the output 1008A.

FIG. 11 shows a harmonic extraction circuit 1100 that includes a quarter-wavelength transmission line 1102, a quarter-wavelength transmission line 1104, a capacitor 1106, and an amplifier 1108. A terminal 1102B of the quarter-wavelength transmission line 1102 is coupled to an input terminal 1110, and to a terminal 1104A of the quarter-wavelength transmission line 1104. The terminal 1104B of the quarter-wavelength transmission line 1104 is coupled to the capacitor 1106 and to $V_{ss}$ or $V_{dd}$. The terminal 1102A of the quarter-wavelength transmission line 1102 is coupled to the input 1108B of the amplifier 1108.

The quarter-wavelength transmission line 1102 and the quarter-wavelength transmission line 1104 are tuned for a selected frequency. For example, in the harmonic extraction circuit 1100, the quarter-wavelength transmission line 1102 and the quarter-wavelength transmission line 1104 are tuned for a quarter-wavelength at 10 GHz. If output signal $v1\pm$ of the frequency multiplication circuit 800 is 2.5 GHz, the frequency of the output signal at the output terminal 802 is 10 GHz. The output terminal 802 is coupled to the input terminal 1110. The 10 GHz signal is provided to the amplifier 1108 via the quarter-wavelength transmission line 1102. The amplifier 1108 amplifies the 10 GHz signal and provides the amplified 10 GHz signal at the output 1108A.

Figure 12:
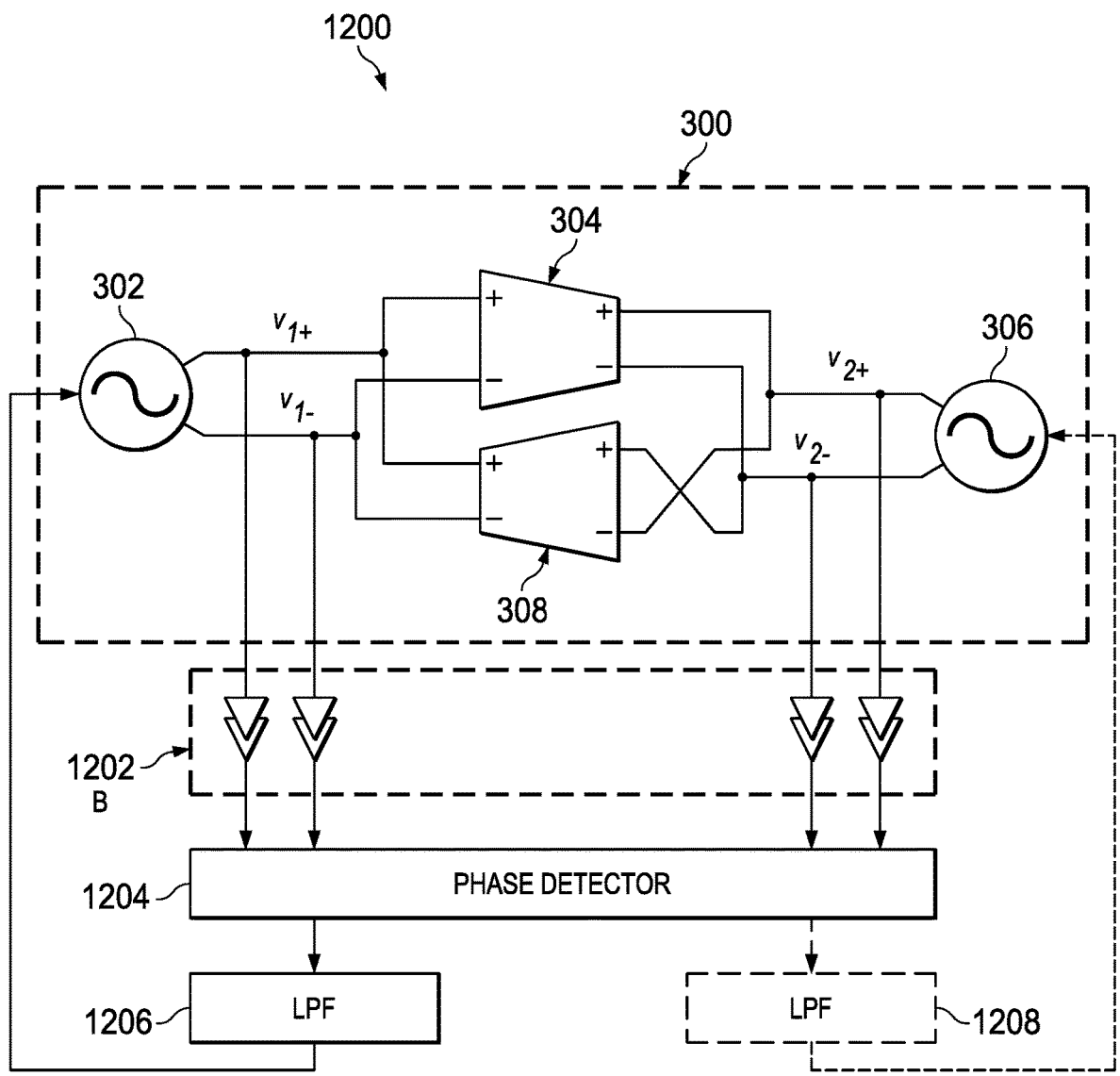
FIG. 12 is block diagram of a multi-phase BAW oscillator that includes phase calibration.

In the multi-phase BAW oscillators described herein, mismatch in the output frequency of the BAW oscillators and/or the delay of the coupling stages may produce phase error in the oscillator output signals. FIG. 12 is block diagram of a multi-phase BAW oscillator 1200 that includes phase calibration to reduce the phase error. The multi-phase BAW oscillator 1200 includes the quadrature oscillator 300, buffers 1202, a phase detector 1204, and a low-pass filter 1206 and/or a low-pass filter 1208. The BAW oscillator 302 and the BAW oscillator 306 may be voltage-controlled BAW oscillators or digitally-controlled BAW oscillators. The phase detector 1204 and the low-pass filter 1206 may be implemented as digital or analog circuits. The phase detector 1204 is coupled to the BAW oscillator 302 and the BAW oscillator 306 via the buffers 1202. The phase detector 1204 compares $v1\pm$ to $v2\pm$ to determine the difference in phase of the two signals. The low-pass filter 1206 and/or the low-pass filter 1208 low-pass filters an error signal (a phase difference signal representative of the difference in phase) generated by the phase detector 1204. The low-pass filtered error signal (a phase adjustment signal) is provided to the BAW oscillator 302 and/or the BAW oscillator 306 to adjust the phase of $v1\pm$ and/or $v2\pm$ (reduce the difference in phase). For example, the low-pass filtered timing error may control a viable capacitor in the BAW oscillator to adjust the phase of the BAW oscillator output signal.

In this description, the term "couple" or "couples" may cover connections, communications, or signal paths that enable a functional relationship consistent with this description. For example, if device A generates a signal to control device B to perform an action: (a) in a first example, device A is coupled to device B; or (b) in a second example, device A is coupled to device B through intervening component C if intervening component C does not substantially alter the functional relationship between device A and device B, such that device B is controlled by device A via the control signal generated by device A. Also, in this description, the recitation "based on" means "based at least in part on." Therefore, if X is based on Y, then X may be a function of Y and any number of other factors.

Modifications are possible in the described embodiments, and other embodiments are possible, within the scope of the claims.

What is claimed is:

1. An oscillator circuit, comprising:
a first bulk acoustic wave (BAW) oscillator circuit having first oscillator terminals and a first control terminal; and
a second BAW oscillator circuit having second oscillator terminals and a second control terminal, in which the first oscillator terminals are coupled to the second oscillator terminals;
a phase detector having a first detector input, a second detector input, and a detector output, the first detector input coupled to one of the first oscillator terminals, and the second detector input coupled to one of the second oscillator terminals; and
a low-pass filter coupled between the detector output and one of the first control terminal of the first BAW oscillator or the second control terminal of the second BAW oscillator.

2. The oscillator circuit of claim 1, further comprising:
a first circuit having first inputs and first outputs, the first inputs coupled to the first oscillator terminals, and the first outputs coupled to the second oscillator terminals; and
a second circuit having second inputs and second outputs, the second inputs coupled to the second oscillator terminals, and the second outputs coupled to the first oscillator terminals.

3. The oscillator circuit of claim 2, wherein the first circuit includes at least one of a capacitor, a resistor, a buffer, an attenuator, or a transconductance amplifier coupled between each of the first inputs and a respective one of the first outputs; and
wherein the second circuit includes at least one of a capacitor, a resistor, a buffer, an attenuator, or a transconductance amplifier coupled between each of the second inputs and a respective one of the second outputs.

4. The oscillator circuit of claim 2, wherein the first circuit includes a first transformer coupled between the first inputs and the first outputs; and
wherein the second circuit includes a second transformer coupled between the second inputs and the second outputs.

5. The oscillator circuit of claim 1, further comprising an edge combiner circuit having combiner inputs and a combiner output, the combiner inputs coupled to the first oscillator terminals and the second oscillator terminals.

6. The oscillator circuit of claim 1, further comprising a third BAW oscillator circuit having third oscillator terminals coupled to the first oscillator terminals.

7. The oscillator circuit of claim 1, wherein the first BAW oscillator circuit has a first center tap terminal coupled to a frequency multiplier output, and the second BAW oscillator circuit has a second center tap terminal coupled to the frequency multiplier output.

8. The oscillator circuit of claim 7, further comprising:
a quarter-wavelength transmission line coupled to the frequency multiplier output; and
an amplifier coupled between the quarter-wavelength transmission line and a harmonic extraction output.

9. The oscillator circuit of claim 1, wherein:
the first BAW oscillator includes:
a first BAW resonator;
a first inductor coupled to the first BAW resonator; and
a second inductor inductively coupled to the first inductor and coupled between the first oscillator terminals, the second inductor coupled to a first center tap terminal; and
the second BAW oscillator includes:
a second BAW resonator;
a third inductor coupled to the second BAW resonator; and
a fourth inductor inductively coupled to the third inductor and coupled between the second oscillator terminals, the fourth inductor coupled to a second center tap terminal.

10. The oscillator circuit of claim 1, wherein the first and second BAW oscillators are configured to provide, respectively, first and second signals at a first frequency; and
wherein the oscillator circuit further comprises a circuit having inputs and an output, the inputs coupled to the first and second oscillator terminals, and the circuit configured to provide a third signal having a second frequency that is a multiple of the first frequency at the output.

11. An oscillator circuit, comprising:
a first oscillator having first oscillator terminals and including a first bulk acoustic wave (BAW) resonator;
a second oscillator having second oscillator terminals and including a second BAW resonator;
a third oscillator having third oscillator terminals and including a third BAW resonator;
a first circuit having first inputs and first outputs, the first inputs coupled to the first oscillator terminals, the first outputs coupled to the second oscillator terminals, the first circuit including a first transformer coupled between the first inputs and the first outputs;
a second circuit having second inputs and second outputs, the second inputs coupled to the second oscillator terminals, the second outputs coupled to the third oscillator terminals, the second circuit including a second transformer coupled between the second inputs and the second outputs; and
a third circuit having third inputs and third outputs, the third inputs coupled to the third oscillator terminals, the third outputs coupled to the first oscillator terminals, and the third circuit including a third transformer coupled between the third inputs and the third outputs.

12. The oscillator circuit of claim 11, wherein:
the first oscillator has a first center tap terminal and includes: a first inductor coupled to the first BAW resonator, and a second inductor inductively coupled to the first inductor and coupled between the first oscillator terminals, the second inductor coupled to the first center tap terminal;
the second oscillator has a second center tap terminal and includes: a third inductor coupled to the second BAW resonator, and a fourth inductor inductively coupled to the third inductor and coupled between the second oscillator terminals, the fourth inductor coupled to the second center tap terminal; and
the third oscillator has a third center tap terminal and includes: a fifth inductor coupled to the third BAW resonator, and a sixth inductor inductively coupled to the fifth inductor and coupled between the third oscillator terminals, the sixth inductor coupled to the third center tap terminal.

13. The oscillator circuit of claim 11, wherein the first oscillator has a first control terminal, the second oscillator has a second control terminal, and the oscillator circuit further comprises:

a phase detector having a first detector input, a second detector input, and a detector output, the first detector input coupled to one of the first oscillator terminals, the second detector input coupled to one of the second oscillator terminals;

a low-pass filter coupled between the detector output and one of the first or second control terminals.

14. The oscillator circuit of claim 11, wherein the oscillator circuit includes an edge combiner circuit having combiner inputs and a combiner output, the combiner inputs coupled to the first oscillator terminals, the second oscillator terminals, and the third oscillator terminals, the edge combiner circuit configured to provide a signal at the combiner output having a frequency based on three times of an oscillation frequency of each of the first, second, and third oscillators.

15. The oscillator circuit of claim 11, wherein the first circuit includes at least one of a capacitor, a resistor, a buffer, an attenuator, or a transconductance amplifier coupled between each of the first inputs and a respective one of the first outputs;

wherein the second circuit includes at least one of a capacitor, a resistor, a buffer, an attenuator, or a transconductance amplifier coupled between each of the second inputs and a respective one of the second outputs; and wherein the third circuit includes at least one of a capacitor, a resistor, a buffer, an attenuator, or a transconductance amplifier coupled between each of the third inputs and a respective one of the third outputs.

16. The oscillator circuit of claim 11, wherein the first, second, and third BAW oscillators are configured to provide, respectively, first, second, and third signals at a first frequency; and wherein the oscillator circuit further comprises a fourth circuit having fourth inputs and a fourth output, the fourth inputs coupled to the first, second, and third oscillator terminals, and the fourth circuit configured to provide a fourth signal having a second frequency that is a multiple of the first frequency at the fourth output.

17. An oscillator circuit, comprising:
a first oscillator having first oscillator terminals, the first oscillator including a first bulk acoustic wave (BAW) resonator;
a second oscillator having second oscillator terminals, the second oscillator including a second BAW resonator, the second oscillator terminals coupled to the first oscillator terminals; and
a frequency multiplier circuitry coupled to the first and second oscillators, the frequency multiplier circuitry including a harmonic extraction circuit.

18. The oscillator circuit of claim 17, wherein:
the first oscillator has a first center tap terminal and includes: a first inductor coupled to the first BAW resonator, and a second inductor inductively coupled to the first inductor and coupled between the first oscillator terminals, the second inductor coupled to the first center tap terminal.

19. The oscillator circuit of claim 18, wherein:
the second oscillator has a second center tap terminal and includes: a third inductor coupled to the second BAW resonator, and a fourth inductor inductively coupled to the third inductor and coupled between the second oscillator terminals, the fourth inductor coupled to the second center tap terminal.

20. The oscillator circuit of claim 19, wherein the harmonic extraction circuit has an input coupled to the first and second center tap terminals and configured to generate a signal having a frequency based on a multiple of an oscillation frequency of each of the first and second oscillators.

21. The oscillator circuit of claim 17, wherein the first oscillator has a first control terminal, the second oscillator has a second control terminal, and the oscillator circuit further comprises:
a phase detector having a first detector input, a second detector input, and a detector output, the first detector input coupled to one of the first oscillator terminals, and the second detector input coupled to one of the second oscillator terminals; and
a low-pass filter coupled between the detector output and one of the first or second control terminals.

22. The oscillator circuit of claim 17, further comprising:
a first circuit having first inputs and first outputs, the first inputs coupled to the first oscillator terminals, and the first outputs coupled to the second oscillator terminals; and
a second circuit having second inputs and second outputs, the second inputs coupled to the second oscillator terminals, and the second outputs coupled to the first oscillator terminals.

23. An oscillator circuit, comprising:
a first bulk acoustic wave (BAW) oscillator circuit having first oscillator terminals;
a second BAW oscillator circuit having second oscillator terminals;
a first circuit having first inputs and first outputs;
a second circuit having second inputs and second outputs, in which:
a first one of the first oscillator terminals is coupled to a first one of the first inputs and to a second one of the second outputs;
a second one of the first oscillator terminals is coupled to a second one of the first inputs and to a first one of the second outputs;
a first one of the first outputs is coupled to a first one of the second oscillator terminals and to a second one of the second inputs; and
a second one of the first outputs is coupled to a second one of the second oscillator terminals and to a first one of the second inputs,
wherein:
the first one of the first oscillator terminals is a positive one of the first oscillator terminals;
the second one of the first oscillator terminals is a negative one of the first oscillator terminals;
the first one of the second oscillator terminals is a positive one of the second oscillator terminals;
the second one of the second oscillator terminals is a negative one of the second oscillator terminals;
the first one of the first inputs is a positive one of the first inputs;
the second one of the first inputs is a negative one of the first inputs;
the first one of the first outputs is a positive one of the first outputs;
the second one of the first outputs is a negative one of the first outputs;
the first one of the second inputs is a positive one of the second inputs;
the second one of the second inputs is a negative one of the second inputs;
the first one of the second outputs is a positive one of the second outputs; and the second one of the second outputs is a negative one of the second outputs.

24. A system comprising:
an oscillator circuit, comprising:
multiple bulk acoustic wave (BAW) oscillator circuits each having respective oscillator terminals and a respective center tap terminal, each of the multiple BAW oscillator circuits configured to provide respective signals having a first frequency at the respective oscillator terminals; and
a first circuit having an input and an output, the input coupled to the center tap terminals of the BAW oscillator circuits, and the first circuit configured to provide a clock signal at the output, the clock signal having a second frequency higher than the first frequency;
a second circuit having a clock input coupled to the output of the first circuit.

25. The system of claim 24, wherein the second circuit includes digital logic circuits.

26. The system of claim 24, wherein the oscillator circuit, the first circuit, and the second circuit is part of an integrated circuit.

\* \* \* \* \*